(12) United States Patent
Paumier et al.

(10) Patent No.: US 7,966,544 B2
(45) Date of Patent: Jun. 21, 2011

(54) LOADING THE INPUT MEMORY OF AN LDPC DECODER WITH DATA FOR DECODING

(75) Inventors: Laurent Paumier, Grenoble (FR);
Pascal Urard, Theys (FR)

(73) Assignee: STMicroelectroncis SA, Montrouge (FR)

( * ) Notice: Subject to any disclaimer, the term of this patent is extended or adjusted under 35 U.S.C. 154(b) by 1090 days.

(21) Appl. No.: 11/737,442

(22) Filed: Apr. 19, 2007

(65) Prior Publication Data
US 2007/0283209 A1 Dec. 6, 2007

(30) Foreign Application Priority Data
Apr. 19, 2006 (FR) ...................................... 06 03456

(51) Int. Cl.
*H03M 13/00* (2006.01)
(52) U.S. Cl. ........ 714/755; 714/786; 714/794; 714/795; 375/341; 375/262
(58) Field of Classification Search .................. 375/341, 375/262; 714/752, 701, 755, 786, 762, 788, 714/794, 795
See application file for complete search history.

(56) References Cited

U.S. PATENT DOCUMENTS

| | | | | |
|---|---|---|---|---|
| 5,359,468 A | * | 10/1994 | Rhodes et al. | 360/48 |
| 5,446,734 A | * | 8/1995 | Goldstein | 370/397 |
| 5,940,863 A | * | 8/1999 | Fimoff et al. | 711/157 |
| 6,647,428 B1 | * | 11/2003 | Bannai et al. | 709/245 |
| 7,000,136 B1 | * | 2/2006 | Alexander et al. | 713/400 |
| 2004/0093458 A1 | | 5/2004 | Kanno et al. | |
| 2005/0204273 A1 | * | 9/2005 | Jeong et al. | 714/801 |
| 2005/0223305 A1 | | 10/2005 | Kons | |
| 2005/0262421 A1 | | 11/2005 | Tran et al. | |
| 2005/0262424 A1 | | 11/2005 | Tran et al. | |
| 2005/0268206 A1 | | 12/2005 | Tran et al. | |
| 2008/0028272 A1 | * | 1/2008 | Richardson | 714/752 |

FOREIGN PATENT DOCUMENTS

| | | |
|---|---|---|
| FR | 2871975 | 12/2005 |
| FR | 2871976 | 12/2005 |

OTHER PUBLICATIONS

Urard, P., et al., "A 135Mb/s DVB-S2 Compliant Codec Based on 64800b LDPC and BCH Codes," IEEE International Solid-State Circuits Conference, 2005, pp. 446-447 and 609.

* cited by examiner

*Primary Examiner* — Guy J Lamarre
(74) *Attorney, Agent, or Firm* — Lisa K. Jorgenson; Robert Iannucci; Seed IP Law Group PLLC

(57) ABSTRACT

An input memory of an LDPC decoder is loaded with data corresponding to an LDPC frame to be decoded and including N LLRs, of which K are information LLRs and N–K are parity LLRs. At least one stream is formed of binary words of a first type, each corresponding to multiple information LLRS, with the aid of a serial/parallel conversion module, and at least one stream is formed of binary words of a second type, each corresponding to multiple parity LLRs, with the aid of a row/column interlacing device comprising a two-dimensional first-in first-out ring buffer. The first memory accesses are made in page mode in order to write the binary words of the first type to a first zone of the input memory, and the second memory accesses are made in page mode in order to write the binary words of the second type to a second zone.

29 Claims, 11 Drawing Sheets

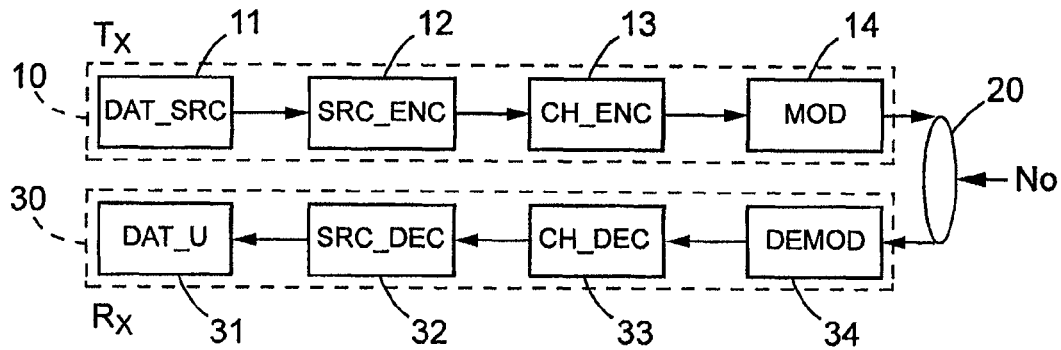

WRITE   READ

LOADING THE INPUT MEMORY OF AN LDPC DECODER WITH DATA FOR DECODING

BACKGROUND OF THE INVENTION

1. Field of the Invention

The present invention relates in general to the decoding of information encoded using a Low Density Parity Check code, or LDPC, and more particularly concerns the loading of the input memory of an LDPC decoder with data to be decoded.

It has applications particularly in devices for receiving signals transmitted by satellite, for example according to the satellite digital video broadcasting standard DVB-S2, which stipulates the use of an LDPC code to protect data transmission.

2. Description of the Related Art

LDPC codes are a class of error correction codes invented in 1960 by Robert Gallager of MIT ("Massachusetts Institute of Technology"), constituting an alternative to the Viterbi codes as well as to the more recent turbo codes. LDPC codes are block codes which allow approaching the Shannon Limit. The first commercial standard stipulating the use of an LDPC code is the DVB-S2 standard, which is the second-generation ETSI ("European Telecommunication Standardization Institute") standard for satellite digital video broadcasting. LDPC coding is included in it for channel coding, to protect the sent data from noise affecting the transmission channel.

With reference to FIG. 1, a generic transmission subsystem contains, on the side of the transmitter 10, a data source 11 (denoted DAT_SRC in the figure), followed by a source encoder 12 (denoted SCR_ENC in the figure), a channel encoder 13 (denoted CH_ENC in the figure), and a modulator 14 (denoted MOD in the figure). The source encoder 12 compresses the data (for example using a standard such as MPEG, H264, etc.) so as to reduce the bit rate of the data to be transmitted. The channel encoder adds redundancy (for example by using an LDPC code) to enable the receiver 30 to correct potential errors due to the noise No introduced into the transmission channel 20. The modulator 14 adapts the signal to the transmission channel (for example, satellite transmission channel, radio transmission channel, etc.). On the receiver side 30, a demodulator 34 (denoted DEMOD in the figure), followed by a channel decoder 33 (denoted CH_DEC in the figure), and a source decoder 32 (denoted SRC_DEC in the figure), perform operations dual to those performed by the modulator 14, the encoder 13, and the encoder 12, respectively. The demodulated and decoded data are then restored to the entity that uses the data 31 (denoted DAT_U in the figure).

LDPC codes are block codes. On the side of the transmitter, the LDPC encoder processes blocks of K information bits, and outputs code words of N bits, also called LDPC frames, where N>K. In other words, it adds N−K redundancy bits which enable the correction of transmission errors on the receiver side. These N−K bits are called parity bits. The code rate is defined as the ratio r=K/N. The smaller the r, the higher the redundancy, and therefore the higher the protection against noise in the transmission channel.

The N−K bits added to each block of K information bits are calculated using an H matrix, called the parity check matrix. This H matrix has N−K rows and N columns. It contains "0" and "1" values, with the latter in low proportions, which is why codes based on such a parity matrix are called low density parity check codes.

With reference to FIG. 2, an N-bit LDPC frame, in which the K low order bits correspond to the information bits and the N−K high order bits correspond to the parity bits, is the code word C delivered by an LDPC encoder which satisfies the relation:

$$H \times C^t = 0 \quad (1)$$

The check node degree for a row in the H matrix is the number of "1" values in the row, and the bit node degree for a column in the H matrix is the number of "1" values in the column. There exist two types of LDPC code: the regular codes and the irregular codes. The H matrix for a regular code has a constant number of "1" values per row and per column, meaning that the check node degrees and bit node degrees are constant. Conversely, the H matrix for an irregular code does not have constant check node degrees and/or constant bit node degrees, and is therefore more random in character. The best performance is obtained with irregular codes, but the decoding may then be more difficult. The DVB-S2 standard recommends the use of an H matrix which has constant check node degrees, between 4 and 30 (abbreviated as matrix check node degree), and bit node degrees which may assume three values between 2 and 13.

On the receiver side, the LDPC decoder corrects the erroneous bits by using the relations between the bits in the LDPC frames received through the transmission channel, corresponding to a block of bits C'. These relations are given by the parity check H matrix, which is of course known to the decoder.

To this effect, the errors in the received block of bits C' are corrected by applying an iterative algorithm so that the corrected block of bits C' satisfies the relation:

$$C' \times H^t = 0 \quad (2)$$

More particularly, the LDPC decoder processes likelihood ratios, for example log-likelihood ratios (LLRs). On the receiver side, there is an LLR for each of the N bits of an LDPC frame which was sent from the transmitter. For a transmitted bit d which has a corresponding signal x received by the LDPC decoder after noise is added to the transmission channel, the LLR ratio for the bit d in relation to the signal x is defined as:

$$LLR(x) = LLR(d/x) = \ln \frac{P(d = 0/x)}{P(d = 1/x)}$$

where P(d=0/x) is the probability that the transmitted bit d is equal to 0 as a function of the value x received, and P(d=1/x) is the probability that the transmitted bit d is equal to 1 as a function of the value x received. Each LLR is coded in m bits. For example, an LLR assumes negative or positive values whose absolute value increases with the probability that the received bit with which it is associated is equal, for example, to 0 or 1 respectively.

The LLR information bits and the LLR parity bits are distinguished as corresponding respectively to the information bits and the parity bits in the LDPC frame.

The LDPC decoder uses internal metrics, equal in number to the number of "1" values in the H matrix. These metrics are each coded in t bits. The decoder updates them using an iterative algorithm.

With reference to FIG. 3, each iteration comprises update steps performed by row, consisting of determining for each row the first new values for the internal metrics of the row as a function of the other internal metrics of the row ("check node update"), then update steps performed by column, consisting of determining for each column the second new values for the internal metrics of the column as a function of the other internal metrics of the column and the LLR corresponding to this column ("bit-node update"). To decode a received LDPC frame, the decoder performs several iterations in order to restore a block of N data sent. The decoded bits, called hard decision bits, are then obtained by adding the internal metrics by column with the LLRs for the C' block received, and taking the sign of the result.

In equipment meeting the DVB-S2 standard, the H matrix consists of a first submatrix A which can have parallel blocks of bit nodes, and a second submatrix B which is a bidiagonal matrix. This form of the H matrix implies a certain manner of loading the data into the input memory of the LDPC decoder.

This write constraint is explained below with reference to the diagram in FIG. 4. This figure represents the memory map for a memory unit of the LDPC decoder input memory, where the data are loaded which are received as input to the decoder and must be stored for decoding. Remember that these data correspond to the N LLRs respectively associated with the N bits of an LDPC frame received by the equipment. In principle, an LLR is received with each cycle of the decoder clock signal.

With P as the parallelism index for the LDPC decoder, meaning the number of processors which perform decoding operations in parallel, the memory map has a number m×P of columns and a number $$\frac{N}{P}$$

of rows. During read operations in page mode the columns may be read simultaneously, obtaining a set of P LLRs coded in m bits each. The $$\frac{N}{P}$$

rows can be broken into two groups: an integer Wa of rows, for example in the upper part of the memory map (above the dashed line), for storing the bits corresponding to the information LLRs; and an integer Wb of rows, for example in the lower part of the memory map (below the dashed line), for storing the bits corresponding to the parity LLRs. The numbers Wa and Wb satisfy the respective relations $$Wa = \frac{K}{P} \text{ and } Wb = \frac{N-K}{P}.$$

In the example represented, the parallelism index P is equal to 6.

The first P words of m bits received as input to the decoder, each corresponding to an information LLR, are written side by side to the first row in the memory map (for example, the one located at the top in the upper part 410A of the memory map), for example from right to left. The next P words of m bits, which also each correspond to an information LLR, are written side by side to the second row, still from right to left. The process continues in this way, as shown by the horizontal arrows in the figure, until the last P words of m bits corresponding to an information LLR received for the frame concerned have been written to the $Wa^{th}$ row in the memory map.

The Wb words of m bits which are then received as input to the decoder, and which each correspond to a parity LLR, are successively written one below another to the Wb rows in the lower part of the memory map, for example from the top to bottom, in a group of m columns located for example in the rightmost part of the lower part of the memory map. The next Wb words of m bits, which also each correspond to a parity LLR, are then written, still from top to bottom, to the Wb rows in the lower part 410b of the memory map in another group of m columns, located immediately to the left of the previous group. The process continues in this way, as shown by the vertical arrows in the figure, until the last Wb words of m bits corresponding to the last parity LLRs received for the frame concerned have been written to the Wb rows in the lower part of the memory map, in the $p^{th}$ group of m columns furthest to the left in the memory map.

BRIEF SUMMARY OF THE INVENTION

The subject matter disclosed reduces the number of writes to the input memory of an LDPC decoder, when loading this memory with the data corresponding to an LDPC frame to be decoded.

In a first embodiment, a process for loading an input memory of an LDPC decoder with data corresponding to an LDPC frame to be decoded comprises a number N of log-likelihood ratios, or LLRs, of which a number K are information LLRs and a number N−K are parity LLRs, where N and K are integers, wherein:

at least one stream of binary words of a first type, each corresponding to multiple information LLRs, is formed with the aid of a serial/parallel conversion module, and at least one stream of binary words of a second type, each corresponding to multiple parity LLRs, is formed with the aid of a row/column interlacing device comprising a two-dimensional "first-in first-out" or FIFO ring buffer, the first memory accesses are made in page mode in order to write the binary words of the first type to a first zone of the input memory, and the second memory accesses are made in page mode in order to write the binary words of the second type to a second zone of the input memory.

The row/column interlacing device is a special case of serial/parallel converter. Here it allows generating words corresponding to the multiple parity LLRs, so said words can then be written to memory in page mode via a reduced number of memory accesses in page mode, while respecting the constraint presented in the introduction concerning the loading of parity LLRs into the input memory as shown in the diagram in FIG. 4. We can consider this constraint to mean an interlacing of the rows/columns of the parity LLRs when they are loaded into the input memory.

Thus, blocks of data of 64800 bits (each corresponding to an LDPC frame) can be successfully loaded into the input memory of a DVB-S2 decoder in only 4320 write operations.

The silicon surface area occupied by the serial/parallel conversion module and the FIFO buffer is small. It only represents about 3% of the total area of the input memory. This signifies that the implementation does not occur at the expense of an exorbitant increase in the silicon surface area required.

A second embodiment relates to a device for loading an input memory of an LDPC decoder with data corresponding to an LDPC frame to be decoded and comprises a number N of log-likelihood ratios, or LLRs, of which a number K are information LLRs and a number N−K are parity LLRs, where N and K are integers. The device comprises:

at least one serial/parallel conversion module configured to form a stream of binary words of a first type each corresponding to multiple information LLRs, as well as at least one row/column interlacing device which comprises a two-dimensional first-in first-out or FIFO ring buffer and which is configured to form a stream of binary words of a second type each corresponding to multiple parity LLRs; as well as a memory access control unit, configured to write in page mode the binary words of the first type to a first zone in the input memory, and to write the binary words of the second type to a second zone in the input memory.

A third embodiment proposes an LDPC decoder incorporating a device according to the second embodiment. This decoder may, for example, be created in the form of an integrated circuit such as a System-on-Chip (SoC).

Lastly, a fourth embodiment proposes an apparatus incorporating an LDPC decoder according to the third embodiment. Such an apparatus may be a digital satellite signal decoder, called a set-top box, or another device.

The input memory loading principle according to the disclosed subject matter allows incorporating a deinterlacing device into the LDPC decoder. The interlacing/deinterlacing of the bits in a block of N bits sent from the transmitter may be provided, to reinforce the robustness of the channel coding. This is recommended in the DVB-S2 standard for higher-order modulations, for example 8-PSK ("Phase Shift Keying") or 16-APSK ("Amplitude and Phase Shift Keying") and 32-APSK.

In principle, an interlacing device is provided in the transmission subsystem between the channel encoder 13 and the modulator 14, and a deinterlacing device is provided in the receiving subsystem between the demodulator 34 and the channel decoder 33 (FIG. 1). Such a deinterlacing device comprises a memory, which increases the silicon surface area occupied by the circuit as well as its power consumption. In addition, the management of this memory raises problems when the LLRs are received at the rhythm of the clock signal of the LDPC decoder so there is no latency to allow for the read and write operations in this memory which are necessary for deinterlacing.

To offset these disadvantages, there are embodiments disclosed wherein, as the LLRs are received in the form of a stream of interlaced LLRs with a depth of interlacing corresponding to a number Q of LLRs, the deinterlacing is achieved by forming in parallel a number Q1 of streams of binary words of the first type using Q1 respective serial/parallel conversation modules and a number Q2 of streams of binary words of the second type using Q2 respective row/column interlacing devices each comprising a two-dimensional FIFO ring buffer, where Q1 and Q2 are specific integers which depend on the code rate $$r = \frac{K}{N}$$

of the LDPC coding and which are such that Q1+Q2≧Q.

It is sufficient to increase the number of serial/parallel conversion devices and/or the number of row/column interlacing devices (the extent depends on the depth of interlacing of the bits in the LDPC frames and the ratio depends on the code rate $$r = \frac{K}{N}$$

of the LDPC coding) in order to integrate the function for deinterlacing the bits of the LDPC frames into the LDPC decoder.

BRIEF DESCRIPTION OF THE SEVERAL VIEWS OF THE DRAWINGS

Other features and advantages of the invention will become apparent in reading the following description. This is purely illustrative and is to be read while referring to the attached drawings, in which:

FIG. 1, already described, is a diagram illustrating a generic data transmission subsystem, FIG. 2, also already described, gives an example of a parity check matrix and illustrates its application in an LDPC frame, FIG. 3, also already described, illustrates the update calculations for check nodes and bit nodes made using the parity check matrix in FIG. 2, FIG. 4, also already described, is a diagram illustrating the mode for loading the input memory of the LDPC decoder.

In the drawings, the same elements or similar elements bear identical references from one figure to the next.

DETAILED DESCRIPTION OF THE INVENTION

Sample Architecture for the LDPC Decoder

Figure 5:
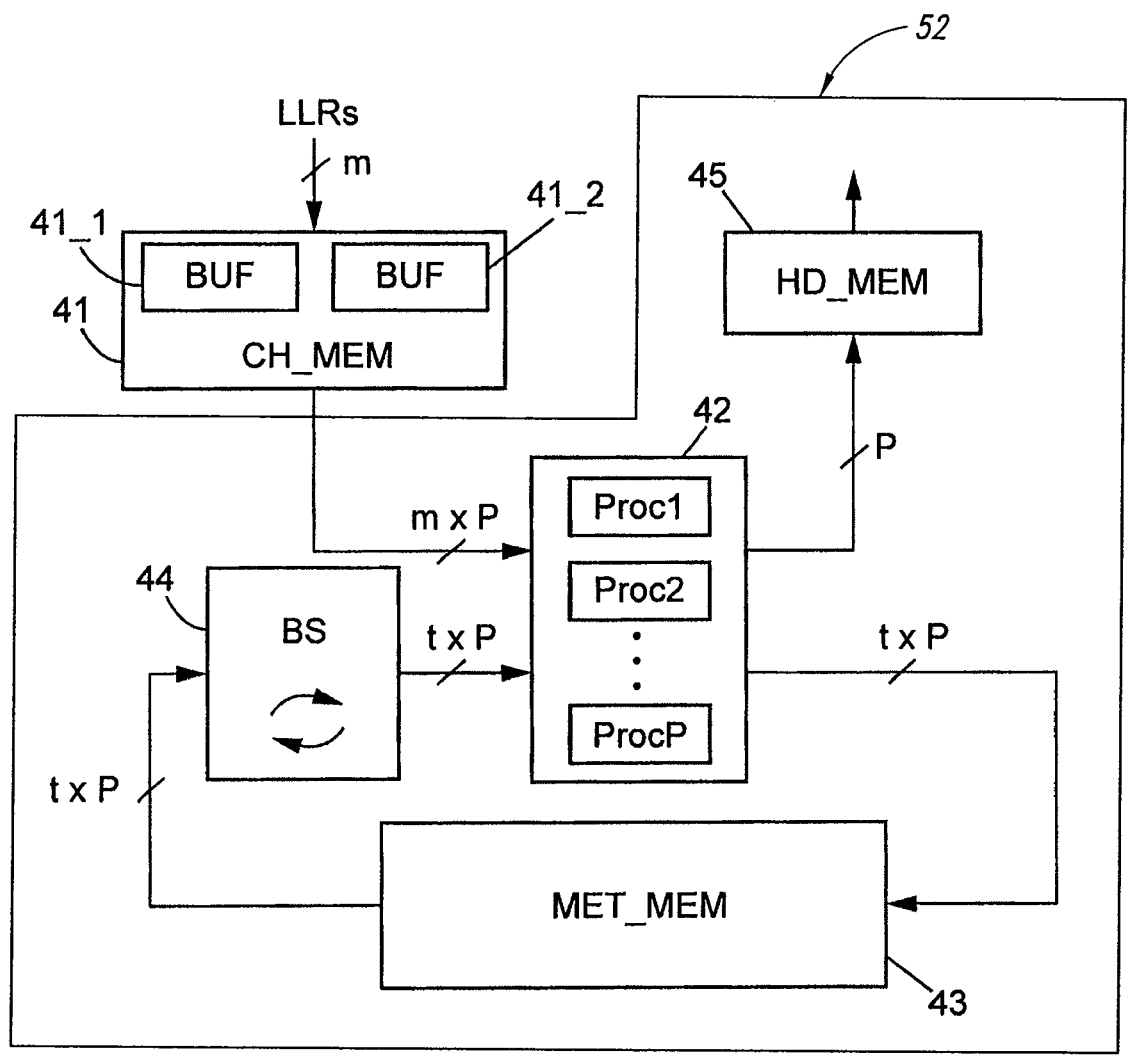
FIG. 5 is a diagram of the architecture of an iterative decoder according to some embodiments.

With reference to FIG. 5, a sample architecture for an LDPC decoder comprises, according to some embodiments, an input memory or channel memory 41 (denoted CH_MEM in the figure) which can store blocks of data to be decoded corresponding to two LDPC frames sent from the transmitter. These data in fact correspond to a number 2×N LLRs.

More particularly, the memory 41 comprises, for example, two single port memory units 41_1 and 41_2. Each of these memory units is for storing a block of data to be decoded, with such a block here indicating the unit of data processed by the iterative decoding algorithm. In other words, each memory unit 41_1 and 41_2 is for storing a block of N×m bits corresponding to the N LLRs associated with a code word previously received and currently being decoded, or a block of N×m bits corresponding to the N LLRs associated with a code word currently being received.

For example, the memory units 41_1 and 41_2 comprise one (or more) single port RAM (or SPRAM), each forming a buffer. As a variant, the units 41_1 and 41_2 may be in the form of one (or more) double port RAM (or DPRAM), which generally occupy more space but are slightly more complex to manage.

In order to accelerate the calculations related to decoding, the decoding unit comprises a processor bank 42, having a number P of parallel processors (denoted Proc1 to ProcP in the figure) which perform in parallel the calculations for the check nodes and bit nodes. The number P is called the parallelism index. The processor bank 42 has read access to the input memory 41 via a bus of m×P wires, for simultaneously reading a set of P LLRs.

During the execution of the iterative process, the processors deliver updated values of internal metrics, each coded in t bits. The internal metrics are stored in a metric memory 43 (denoted MET_MEM in the figure), which has a capacity equal to t times the number of metrics (meaning t times the number of "1" values in the H matrix). The internal metrics stored in the memory 43 are delivered to the processor bank 42 via a P-channel mixer, such as a barrel shifter 44 (denoted BS in the figure) in the case of the DVB-S2 standard. The memory 43 is read and write accessible via respective buses of t×P wires.

After the last iteration, the processor bank 42 also, in a known manner, delivers hard decision bits which assume the values "1" or "0" depending on the sign of the sum of the columns of the H matrix and the LLRs for the C' word of the corresponding rank. These hard decision bits are stored temporarily in an output buffer, or hard decision memory 45 (denoted HD_MEM in the figure), in principle (meaning in standard decoders) until they are overwritten by the hard decision bits resulting from decoding the next frame. The capacity of the memory 45 is equal to N, the size of an LDPC frame. The processor bank 42 can write to the memory 45 via a bus of P wires.

The elements 42, 43, 44 and 45 form a decoding unit of the decoder 52, here an LDPC decoding unit, which is configured for processing the data stored in the input memory 41.

Sharing the Memory Map Between Several RAM Memories

When the memory map offers page mode access, it can be addressable by binary words, each corresponding to a number P of parallel LLRs. It follows that each word corresponding to a number P of information LLRs which must be stored side by side in the respective Wa rows in the upper part 41a of the memory map (FIG. 4, discussed in the introduction) may be written to the memory map in a single write. In this way an entire row is written all at once to the part 41a. One therefore has write access for all P information LLRs received.

For a high parallelism index, RAM memories able to contain m×P bits per row cannot exist (technology constraint). In this case, but not only this case, there can be a parallel arrangement of smaller multiple RAM memories.

The parallel arrangement of the memories also allows reducing the devices for writing an integer L of LLRs side by side to the same row. In exchange, the number of write accesses is multiplied relative to the case where only a single RAM memory is used (if it exists) containing m×P bits per row. Technically, the largest possible RAM buffers are chosen in order to decrease the total power consumption.

In other words, particularly when the parallelism index P is large (for example P=360, as recommended in the DVB-S2 standard), the memory map may be an arrangement of multiple RAM memories, each with n columns and Wa+Wb rows, where m<n<P×m. Each of these RAM memories can store an integer L of LLRs side by side in the same row, where 1<L<P. The memory map is then implemented as a number $$\frac{P}{L}$$

of parallel RAM memories. The memory map is therefore addressable by binary words, each corresponding to a number L of parallel LLRs.

The expression "parallel arrangement of RAM memories" is understood to mean that the RAM memories are, for example, placed side by side on the silicon. Functionally, a given row of index i in the memory map corresponds to a row of the same index in each of the RAM memories, and each column in the memory map corresponds to a specific column in a given RAM memory. An ad-hoc addressing mechanism enables selecting only one of the RAM memories which compose the memory map, during a write or read access.

This known arrangement allows reducing the length of the rows which are effectively addressed during a write in page mode, and therefore reducing the power consumption for each write.

Figure 6:
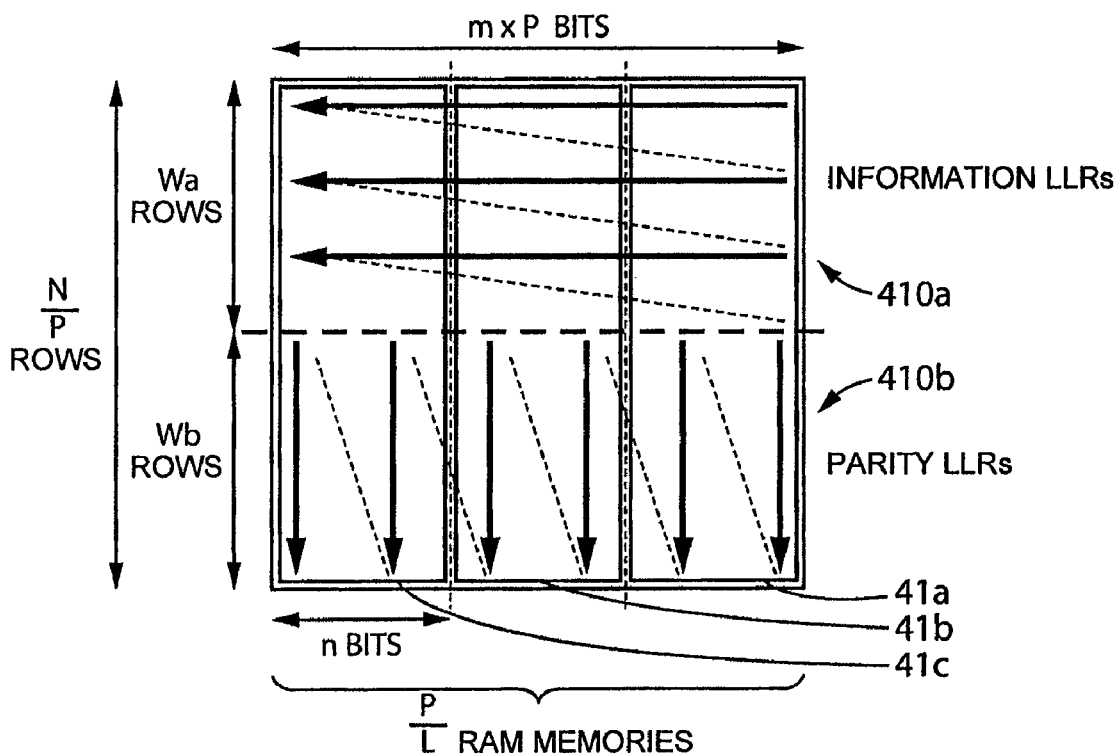
FIG. 6 is a diagram illustrating the mode for loading the input memory of the LDPC decoder when this memory is an arrangement of parallel RAM memories, according to one embodiment.

In the example illustrated in FIG. 6, where P=6, there are three RAM memories, respectively labeled 41a, 41b and 41c, each of which can store two LLRs (meaning L=2 here).

Summary of Notations Used

For reasons of clarity, the main notations used in the present description are listed again or introduced for the first time in table I below.

TABLE I

| | |
|---|---|
| N | Size of an LDPC frame as the number of LLRs |
| K | Number of information LLRs per LDPC frame |
| N − K | Number of parity LLRs per LDPC frame |
| m | Number of bits coding an LLR |
| P | Parallelism index for the LDPC decoder |
| P × m | Total number of columns (bits) in the input memory |
| $wa = \frac{K}{P}$ | Number of rows in the input memory (and therefore in each of the RAM memories comprising it) for storing the information LLRs |
| $wb = \frac{N-K}{P}$ | Number of rows in the input memory (and therefore in each of the RAM memories comprising it) for storing the parity LLRs |
| $r = \frac{K}{N} = \frac{wa}{wa+wb}$ | Code rate for the LDPC coding algorithm |
| L | Number of LLRs in the same row of one of the RAM memories comprising the input memory |

TABLE I-continued

| | |
|---|---|
| P/L | Number of RAM memories comprising the input memory |
| n = L × m | Number of columns (bits) in each of the RAM memories comprising the input memory |

In one embodiment, K=16200, N=64800, P=360, m=6, t=6, L=15, n=90, $$\frac{P}{L} = 24,$$

and P×m=2160.

Example of a Device without Interlacing

Figure 7:
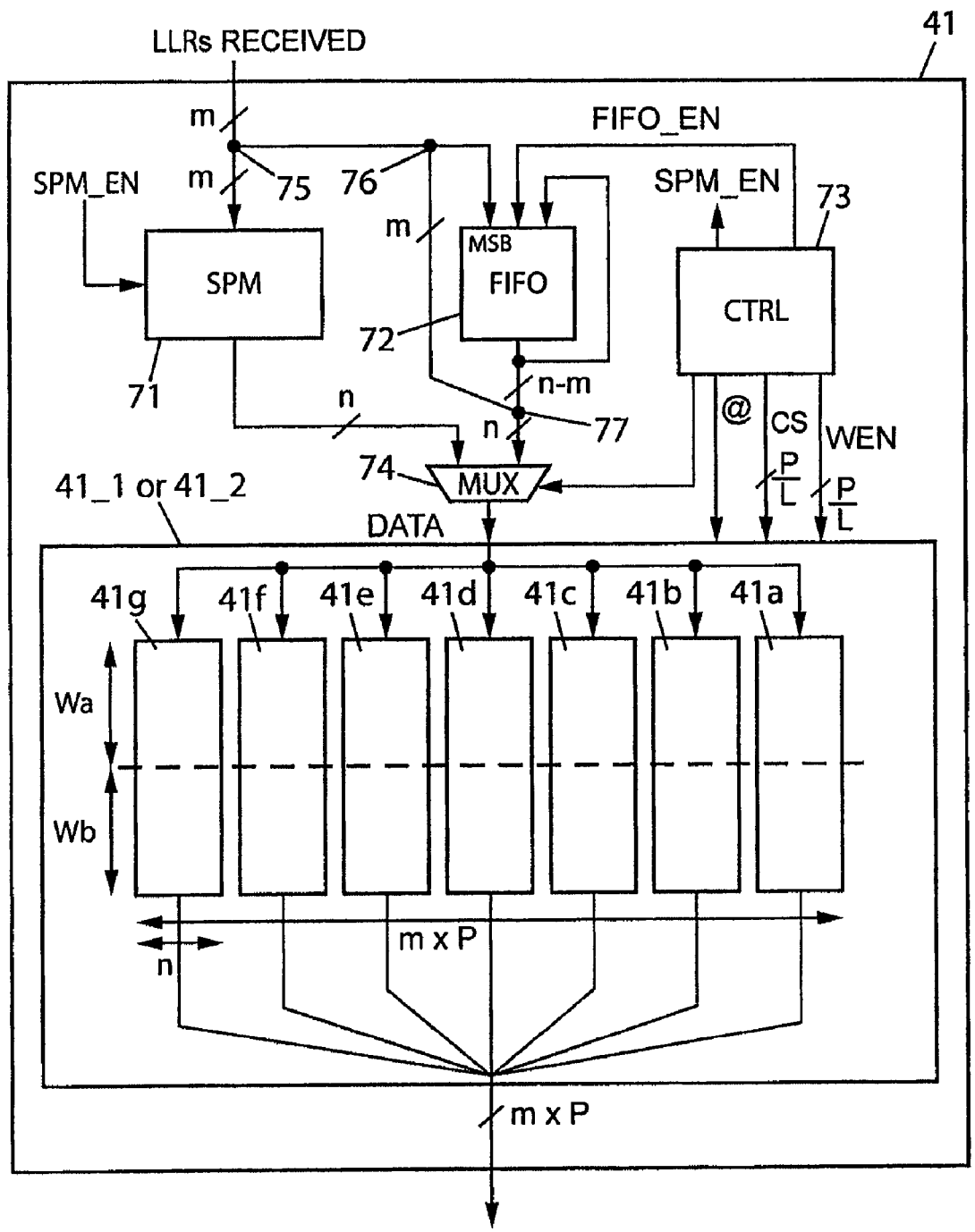
FIG. 7 is a functional diagram of an embodiment of a device.

With reference to FIG. 7, an embodiment of the input memory loading device 41 comprises the elements which will now be described for the case where the LLRs received by the LDPC decoder are not interlaced. Such a case corresponds either to a transmission of LDPC frames without bit interlacing, or to a transmission of LDPC frames with bit interlacing when a deinterlacing device is provided upstream from the LDPC decoder.

In the example represented, the memory map of the input memory 41 is achieved with seven parallel RAM memories, 41a to 41g respectively.

The input memory loading device 41 comprises a serial/parallel conversion module 71 or SPM, a two-dimensional first-in first-out (FIFO) ring buffer 72, a control module 73, and a multiplexer 74. These allow loading the memory unit 41_1 (or 41_2) of the input memory 41 with the data corresponding to the LLRs of an LDPC frame to be decoded. The operation of the device is synchronous with the clock signal CLK of the LDPC decoder.

Switching devices such as a demultiplexer, not represented (occurring in the functional node 75), also allow providing the K information LLRs as input to the SPM and directing the N−K parity LLRs to the FIFO from the memory input 41. In fact, the Wb last parity LLRs are also sent directly to the output of the FIFO 72 by means not represented (occurring in the functional node 76). Each of these Wb last LLRs is concatenated by means not represented (occurring in the functional node 77, corresponding to the output of the FIFO) with a binary word corresponding to a number L−1 of parity LLRs read from the FIFO 72, in sync with the Wb successive leading edges of the CLK signal. The FIFO is in fact set up to output binary words corresponding to L−1 parallel parity LLRs, as will be explained below.

The SPM 71 receives the information LLRs serially as input, at the rate for example of one LLR per cycle of the CLK signal, and outputs a stream of what is called binary words of a first type. These binary words correspond to a number L of parallel information LLRs (meaning placed side by side by concatenation). In other words, the binary words of this first type are coded in a number n=L×m of bits. The implementation of the SPM does not call for any special comment here, as a person skilled in the art can create it on the basis of the functional characteristics given above, using only his general knowledge.

In the functional node 77, a stream of what is called binary words of a second type is issued. These binary words of the second type are binary words corresponding to a number L of parallel parity LLRs, which are coded in n bits. The binary words stored in the FIFO 72 are binary words corresponding to a number L−1 of parallel parity LLRs, and are coded in a number n−m of bits.

Figure 8:
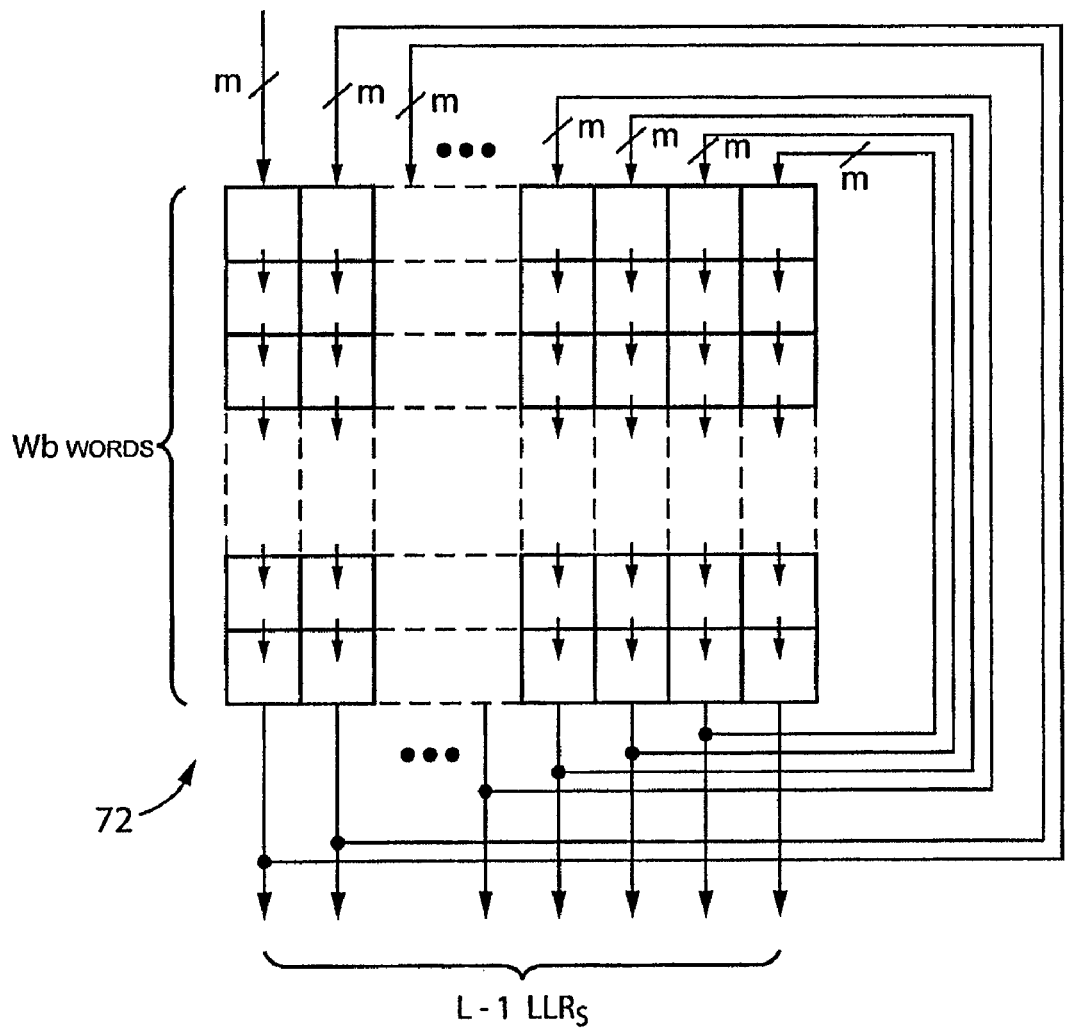
FIG. 8 is a diagram illustrating the principles of operation of a row/column interlacing device comprising a two-dimensional FIFO ring buffer, according to one embodiment.

The output of the SPM and the functional node 77 are connected to the respective inputs of the multiplexer 74, which multiplexes the streams of binary words of the first type and the second type just upstream from the circuits which write to the memory. As is shown in FIG. 8, the FIFO 72 is in fact able to store a number Wb of binary words each corresponding to L−1 LLRs (parity LLRs here), which are themselves coded in m bits each. In practice, the FIFO may be designed as a matrix of Wb rows and (L−1)×m columns, comprising Wb×(L−1) memory units, each able to store an LLR coded in m bits. These memory units are for example arranged in the format of L−1 shift registers (arranged vertically here) of Wb units each. Each memory unit in the FIFO, which is identified by its {i,j} coordinates where i indicates the row number and j indicates the column number in the matrix, can store an LLR coded in m bits. The path of the LLRs in the FIFO 72 is adapted to ensure the desired row/column interlacing.

In the illustration given as an example in FIG. 8, the entry of LLRs into the FIFO, which occurs for example at the rate of one LLR per clock cycle during receipt of the parity LLRs, occurs in the memory unit at coordinates $\{1,1\}$ at the upper left of the matrix. With each input of a new LLR, the first LLR received progresses down the first column (i.e., the leftmost one) towards the bottom of the matrix, as indicated by the small arrows in this column. The entry of the LLR which follows after the first Wb LLRs received by the FIFO causes the first LLR received to move from the memory unit at coordinates $\{Wb,1\}$ to the memory unit at coordinates $\{1,2\}$, which is the first memory unit (i=1) in the second column (j=2). The input of subsequent LLRs causes the first LLR received to progress down the second column towards the bottom of the matrix, as indicated by the small arrows in this column. The input of the LLR which follows after the first 2×Wb LLRs received by the FIFO causes the first LLR received by the FIFO to move from the memory unit at coordinates $\{Wb,2\}$ to the memory unit at coordinates $\{1,3\}$, and also causes the $Wb^{th}$ LLR received by the FIFO to move from the memory unit at coordinates $\{Wb,1\}$ to the memory unit at coordinates $\{1,2\}$. The process continues in this manner, as indicated by the connections between the top and bottom of the matrix. The FIFO is completely loaded when Wb×(L−1) parity LLRs have been received. The formation of Wb words of the second type begins upon receipt of the next parity LLR, such a word being formed upon receipt of each of the subsequent Wb parity LLRs. The entry of the $\{Wb×(L−1)\}^{th}$ parity LLR into the FIFO causes the loss of the first LLR received by the FIFO.

To indicate such an operation of the FIFO, one can say that the FIFO is a two-dimensional FIFO ring buffer, in this case with Wb words of L−1 LLRs each, which assures a row/column interlacing function.

Once the FIFO is completely loaded, Wb words of L−1 LLRs are read in succession from this FIFO, each time the word stored in the $Wb^{th}$ row (the bottom one), under the control of the module 73. Each of the words of the L−1 LLRs read in this way is concatenated to an $L^{th}$ parity LLR, which is the parity LLR received at each of the subsequent Wb leading edges of the CLK signal, and which is sent from the functional node 76 to the functional node 77, to form the stream of binary words of the second type.

The implementation of the FIFO does not call for further comment here, as a person skilled in the art could create it based on the functional characteristics given above, using only his general knowledge. In particular, flip-flops, a DPRAM of Wb words, or two SPRAM of Wb/2 words each could be used.

Example of Operation without Interlacing

The operation of the input memory loading device of the decoder during the receipt of the N LLRs corresponding to a given LDPC frame is explained below, using the example of the device presented above with reference to the diagram in FIG. 7.

The module 73 controls the formation of a stream of $$\frac{P}{L} \times Wa$$

binary words of the first type, each corresponding to a number L of information LLRs, with the aid of the SPM, and the formation of a stream of $$\frac{P}{L} \times Wb$$

binary words of the second type, each corresponding to a number L of parity LLRs, with the aid of the FIFO. For this purpose, the module 73 issues enable signals SPM_EN and FIFO_EN to the SPM and the FIFO respectively.

Still under the control of the module 73, first memory accesses are made to write the binary words of the first type to a first zone of the input memory corresponding to the top part (the upper Wa rows) of the memory map, and second memory accesses are made to write the binary words of the second type to a second zone of the input memory corresponding to the bottom part (the lower Wb lines) of the memory map. For this purpose, the module 73 controls the multiplexer 74 through which these accesses to the memory map are made. In addition, it issues to the memory unit 41_1 (or 41_2) an address signal @, a circuit selection signal CS, and a write enable signal WEN. The write is then made to a specific memory location, its width corresponding to a number L of LLRs, in one of the RAM memories, here numbering 7 and labeled 41a to 41g, which form the memory map. The WEN and CS signals consist of 7 signals each, one for each RAM memory in the memory map, but this breakdown is not represented so as not to clutter up the figure.

The operation will now be illustrated with reference to FIGS. 9, 10, and 11A-11D, using an example where N=12, K=6, Wa=2, Wb=2, P=L=3 (to simplify, the input memory is considered in this example to comprise a single RAM memory).

Figure 9:
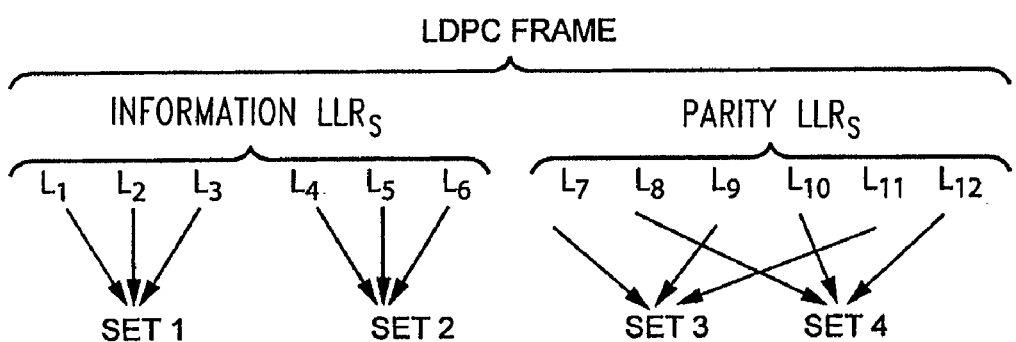
FIG. 9 is a diagram illustrating the composition of the binary words of the first and second type from a stream of LLRs corresponding to an example of an LDPC frame, according to one embodiment.

As is shown in FIG. 9, the LDPC frame to be decoded is a 12-bit frame, such that the information to be decoded corresponds to 12 LLRs, labeled $LLR_i$, where i is between 1 and 12. Six of these are information LLRs (labeled $L_i$ where i is between 1 and 6) and six of these are parity LLRs (labeled $L_i$ where i is between 7 and 12). The parallelism (index P=3) for the processing performed by the LDPC decoder requires the formation of four sets of 3 LLRs each. Due to the form of the H matrix recommended in the DVB-S2 standard, a first and a second set of LLRs respectively comprise the LLRs with indices of 1, 2, and 3 and the LLRs of 4, 5, and 6 (information LLRs), while a third and fourth set of LLRs respectively comprise the LLRs with indices of 7, 9, and 11 and the LLRs with indices of 8, 10, and 12 (parity LLRs).

The loading of the LDPC decoder input memory, which here is a matrix with 4 rows and a width corresponding to 3 LLRs, occurs in four write operations to the memory, which means four memory accesses. A stream of 2 words of 3 information LLRs each is formed (binary words of the first type), in other words $L_3L_2L_1$ and $L_6L_5L_4$, and a stream of 2 words of 3 parity LLRs each is formed (binary words of the second type), in other words $L_{11}L_9L_7$ and $L_{12}L_{10}L_8$. The first stream is formed with the aid of the SPM, and the second is formed with the aid of the FIFO.

The process for loading the input memory will now be explained in detail, with reference to the timing diagrams in FIG. 10 and the diagrams in FIGS. 11A-11D.

Figure 10:
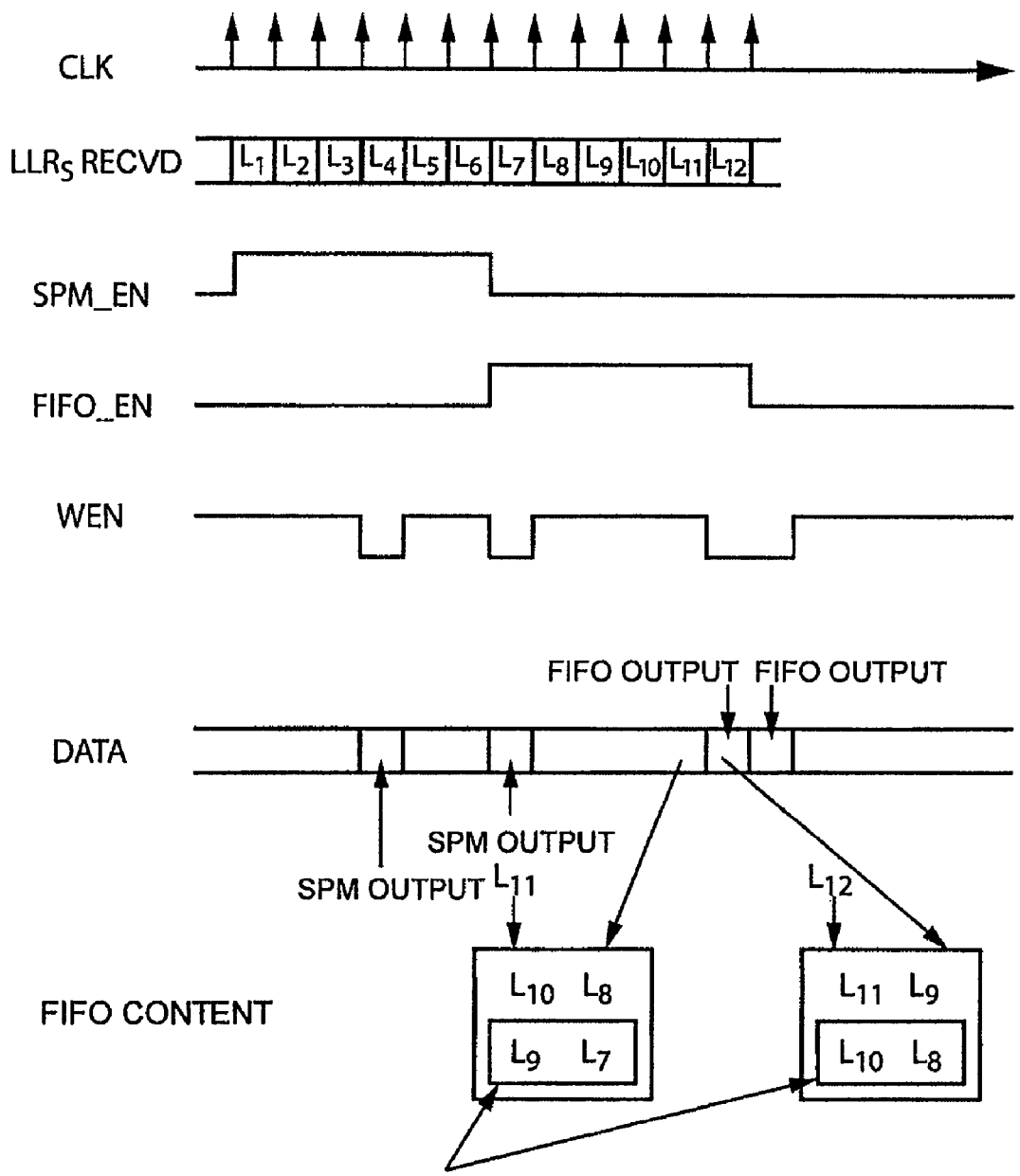
FIG. 10 shows signal timing diagrams to illustrate the operation of the device in FIG. 8, according to one embodiment.
Figures 11A, 11B, 11C, 11D:
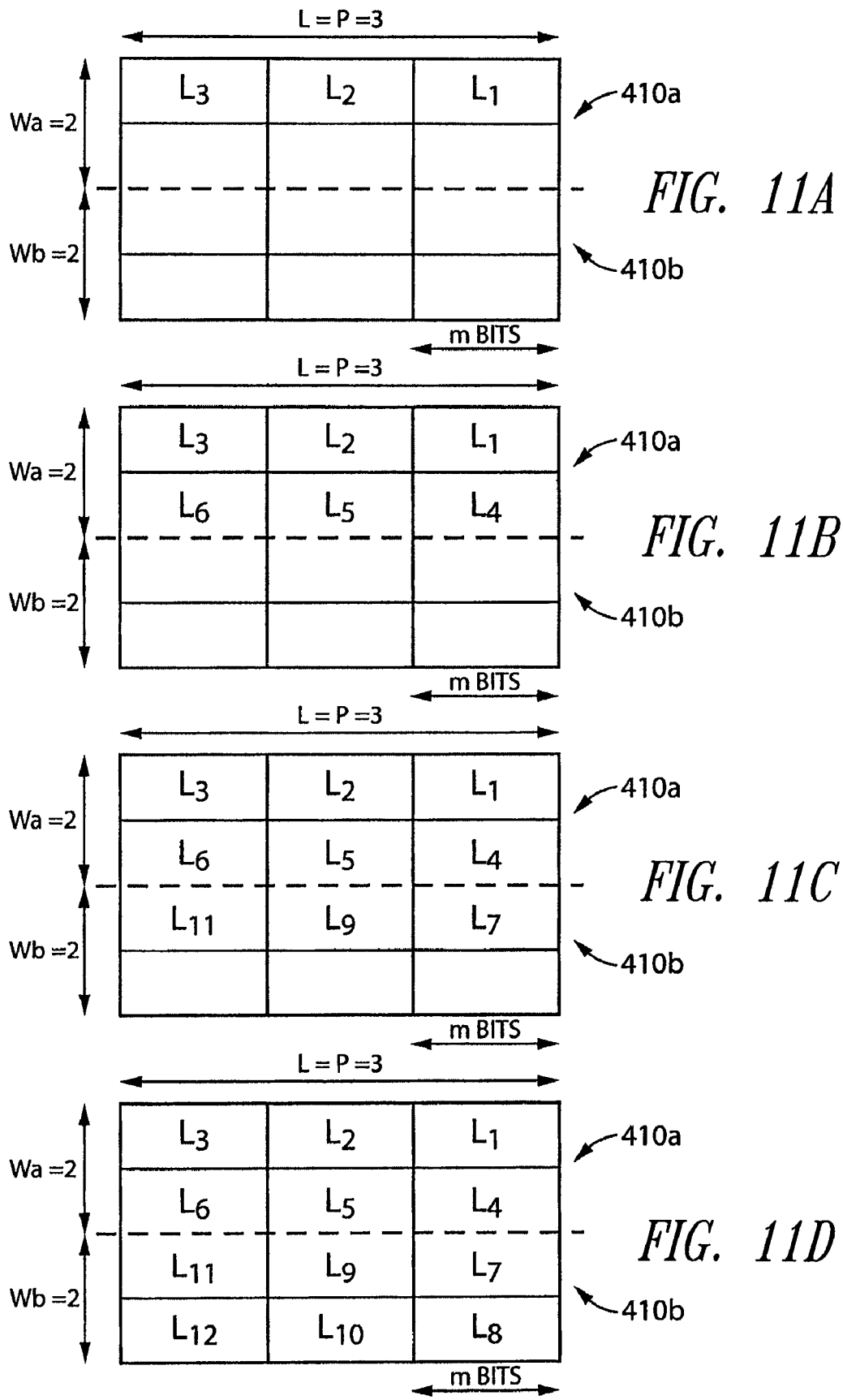
FIGS. 11A-11D are diagrams illustrating the loading of the input memory of an LDPC decoder in the context of the example shown in FIGS. 9 and 10.

In FIG. 10, the vertical arrows in the top row represent the leading edges of the clock signal CLK for the LDPC decoder. As is shown in the second row immediately below, an LLR is received with each leading edge of the CLK signal. In this row, only the 12 LLRs corresponding to a frame are represented in the example in question, which are the LLRs labeled $L_i$ where i is between 1 and 12. The sixth row indicates the clock cycles where the data originating from the SPM 71 (events labeled "SPM output") and from the FIFO 72 (events labeled "FIFO output") are written to the memory map.

The formation of the stream of binary words of the first type begins with the receipt of the first information LLR, which is $L_1$. For this purpose the control module 73 sets the signal SPM_EN to its active state, in this example the high logical state ($3^{rd}$ row in FIG. 10). After receiving the first three information LLRs, $L_1$, $L_2$ and $L_3$, the module 73 activates the write enable signal WEN for the input memory ($5^{th}$ row in FIG. 10), in this example by changing it from the high logical state to the low logical state, during one clock cycle. The binary word $L_3L_2L_1$ is then written to the first row in the top part 410a of the buffer. This obtains the load state for the LDPC decoder input memory which is illustrated by the diagram in FIG. 11A. When the WEN signal returns to the high logical state, the signal SPM_EN remains in the active state in order to receive the next three information LLRs, which are $L_4$, $L_5$ and $L_6$. After receiving the last LLR in the second set of information LLRs, which is $L_6$, the WEN signal is reenabled, and the binary word $L_6L_5L_4$ is written to the second row in the top part 410a of the input memory. This obtains the load state for the LDPC decoder input memory which is illustrated by the diagram in FIG. 11B. As for the SPM_EN signal, it is deactivated after the receipt of $L_6$.

The formation of the stream of binary words of the second type begins with the receipt of the first parity LLR, which is $L_7$. For this purpose the control module 73 sets the signal FIFO_EN to its active state, in this example the high logical state ($4^{th}$ row in FIG. 10). The parity LLRs are then directed, not towards the SPM, but towards the FIFO, into which they are loaded as explained above with reference to the diagram in FIG. 8.

After receipt of the first four parity LLRs, which are $L_7$, $L_8$, $L_9$ and $L_{10}$, the load state of the FIFO is the one illustrated at the bottom left of FIG. 10. The box indicated by an arrow corresponds to the word of L−1 (i.e., 2) parity LLRs, meaning the binary word $L_9L_7$, which is stored in the bottom row of the FIFO. To this word is concatenated to the side of the high order bits the next parity LLR, meaning $L_{11}$, which enters the FIFO but also passes on by the FIFO to form the binary word $L_{11}L_9L_7$. This word, which is a word of the second type, corresponds to the third set of LLRs (parity) identified above with reference to the diagram in FIG. 9. This formation takes place upon receipt of $L_{11}$. The word $L_{11}L_9L_7$ is then written to the first row of the bottom part 410b of the input memory. For this purpose, the control module 73 activates the WEN signal (low logical state). This obtains the load state for the LDPC decoder input memory which is illustrated by the diagram in FIG. 11C.

The load configuration illustrated at the bottom right of FIG. 10 is obtained simultaneously in the FIFO. Upon receipt by the FIFO of the next parity LLR, $L_{12}$, which also passes on by the FIFO, the first parity LLR received, $L_7$, is lost. The box indicated by an arrow corresponds to the word of L−1 (i.e., 2) parity LLRs, meaning the binary word $L_{10}L_8$, stored in the bottom row of the FIFO. To this word is concatenated to the side of the high order bits, at the next leading edge of the CLK signal, the LLR $L_{12}$ which enters the FIFO but also passes on by the FIFO to form the binary word $L_{12}L_{10}L_8$. This word of the second type corresponds to the fourth set of LLRs (parity) identified above with respect to the diagram in FIG. 9. The module 73 maintains the write enable signal WEN for the input memory (5$^{th}$ row in FIG. 10) during an additional clock cycle. The binary word $L_{12}L_{10}L_8$ is then written to the second row in the bottom part 410b of the memory. This obtains the load state for the LDPC decoder input memory which is illustrated by the diagram in FIG. 11D.

Figure 4:
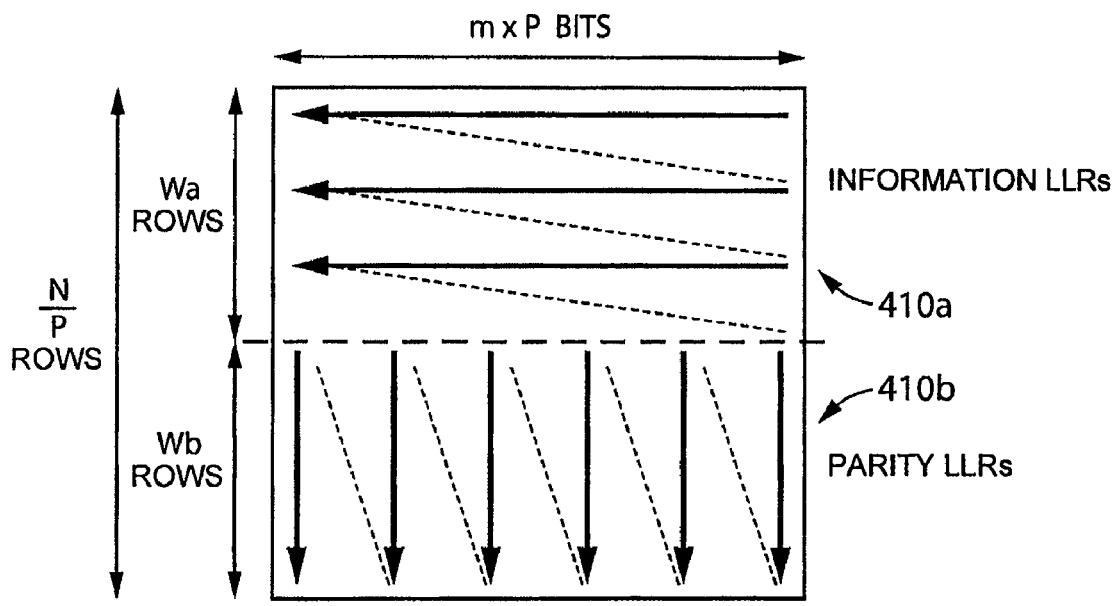

One may note in the above example that after the memory is loaded according to this process, a distribution of the LLRs of the LDPC frame is obtained which meets the description given in the introduction with reference to the diagram in FIG. 4.

Above all, one will note that loading the input memory in compliance with the specifications of the DVB-S2 standard only requires 4 writes to the input memory in the example, while loading according to the prior art method described with reference to FIG. 4 would require 12 writes to the memory (with 6 of these memory accesses made to write the 6 parity LLRs in sync with the clock signal CLK at the time these LLRs are received). The subject matter disclosed therefore substantially reduces the number of write operations to the input memory.

The additional silicon surface area occupied by the SPM and the FIFO remains acceptable. The layout of the decoder input memory in the form of $$\frac{P}{L}$$

parallel RAM memories also contributes to rendering this additional surface area acceptable, as the smaller the size of the words of the first and second types, the smaller the area occupied by the SPM and FIFO.

Loading the Input Memory With Deinterlacing

We will now describe the embodiments in which the loading of the input memory additionally implements the deinterlacing of the bits in the LDPC frame received by the encoder. This is the case where the bits of the LDPC frames sent through the channel are interlaced on the transmitter side. The present embodiments are advantageous because in these embodiments the receiver has no need for a dedicated deinterlacing device.

The interlacing of the bits of an LDPC frame received by the decoder is reflected in a corresponding interlacing of the LLRs to be loaded into the internal memory of the LDPC decoder. This is why, in what follows, the LLRs are considered to be fed to the LDPC decoder input memory in the form of a stream of interlaced LLRs. This involves row/column interlacing. The depth of the interlacing corresponds to a number Q of LLRs, where Q is a specific integer. In such a case, a prior art memory with Q columns will be used for the deinterlacing.

Figure 12:
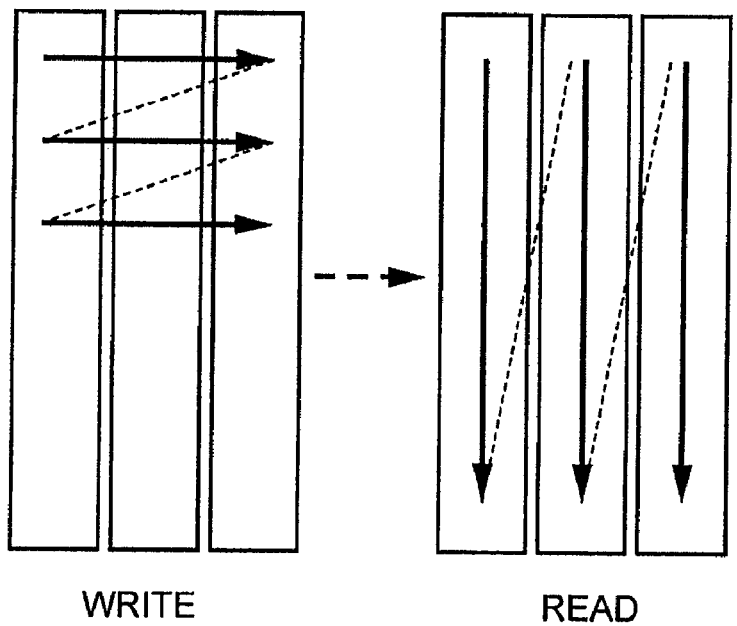
FIG. 12 is a diagram illustrating the general principles of the row/column bit interlacing, according to one embodiment.

The general principle of the deinterlacing is shown in the diagram in FIG. 12, for the case where the interlacing depth corresponds to 3 LLRs (Q=3). As is illustrated by the arrows in the left part of the figure, the LLRs are first written in rows to a memory of 3 columns. The LLRs are then read in columns from this memory, or in other words all the LLRs of a column are read, column after column, as illustrated by the arrows in the right part of the figure.

Here, the memory used is directly the input memory of the LDPC decoder. In other words, the deinterlacing is performed at the same time as the loading of the LLRs into the input memory of the LDPC decoder, in one process. For this purpose at least Q distinct streams of deinterlaced LLRs are formed from the stream of interlaced LLRs received as input.

The principle of deinterlacing, combined with the loading of the LDPC decoder input memory according to the embodiments, is explained with reference to the diagram in FIG. 13, still for the case of interlacing with a depth corresponding to 3 LLRs (Q=3). 3 streams of LLRs are formed in parallel, each fed one out of three LLRs received. For example, using an index assuming the ordinal values 0,1,2,3,4, etc. to indicate the order of the LLRs in the stream of interlaced LLRs, the following streams are formed in parallel: a first stream of LLRs (Stream 1) containing the LLRs with indices of 0,3,6, etc., a second stream of LLRs (Stream 2) containing the LLRs with indices of 1,4,7, etc., and a third stream of LLRs (Stream 3) containing the LLRs with indices of 2,5,8, etc.

Figure 13:
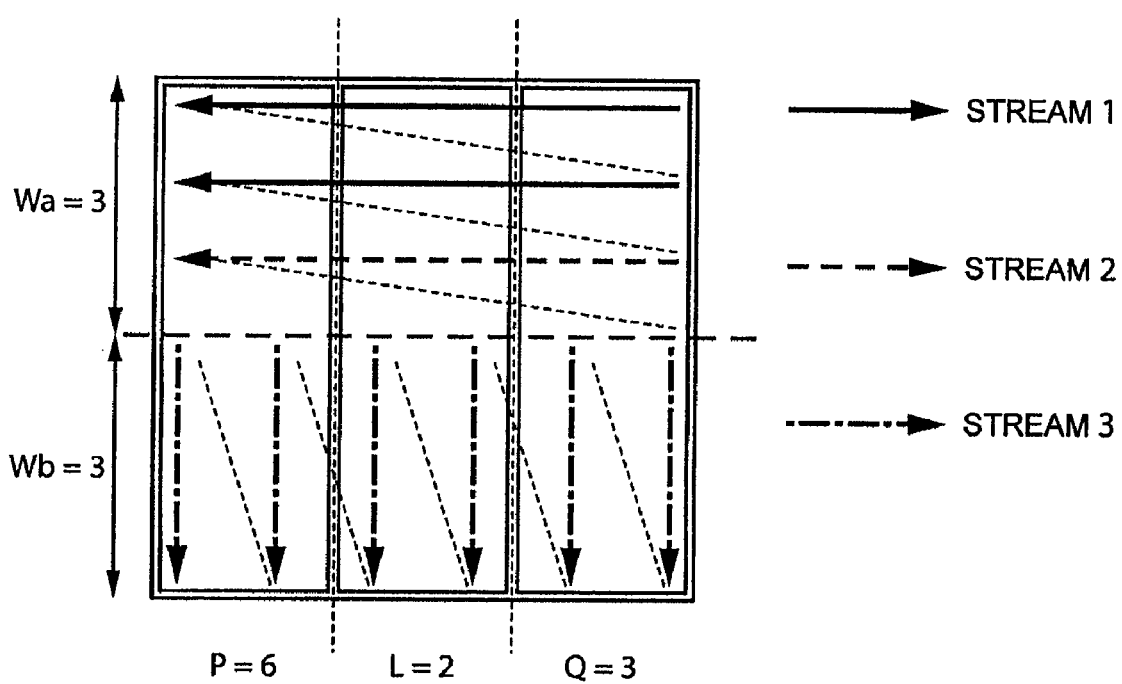
FIG. 13 illustrates the loading of the input memory of the LDPC decoder in the case of a stream of interlaced LLRs, with an interlacing depth corresponding to three LLRs, according to one embodiment.

These three distinct streams of LLRs must be written to the LDPC decoder input memory as indicated by the arrows in FIG. 13.

One will recall, however, according to the principle explained above for loading the LDPC decoder input memory, that separate methods are used for forming a stream of information LLRs and a stream of parity LLRs for loading into the input memory: an SPM and a two-dimensional FIFO ring buffer respectively. This is why it may be necessary to form more than Q such streams of deinterlaced LLRs, depending on the values of the depth Q of the interlacing of the LLRs and the code rate $$r = \frac{K}{N}$$

of the LDPC coding. In addition, one may need to form Q streams of deinterlaced information LLRs, and Q streams of deinterlaced parity LLRs, taking into account all possible values between 0 and 1 which may be assumed by the code rate $$r = \frac{K}{N}.$$

At most, one may need to form Q streams of deinterlaced information LLRs, and Q streams of deinterlaced parity LLRs, taking into consideration all possible values between 0 and 1 which the code rate $$r = \frac{K}{N}$$

may assume. In other words, the maximum number of SPMs and the maximum number of two-dimensional FIFO ring buffers necessary to implement the deinterlacing for the proposed principle of loading the LDPC decoder input memory are both equal to Q.

For a given value of the code rate $$r = \frac{K}{N},$$

deinterlacing is achieved by the parallel formation of a number Q1 of streams of binary words of the first type by Q1 respective serial/parallel conversion modules (SPM), and a number Q2 of streams of binary words of the second type by Q2 respective row/column interlacing devices each comprising a two-dimensional FIFO ring buffer, where Q1 and Q2 are specific integers (which depend on the code rate $$\left(\text{which depend on the code rate } \frac{K}{N}\right).$$

These numbers are such that Q1+Q2≧Q.

It is therefore sufficient to increase the number of serial/parallel conversion devices and/or the number of row/column interlacing devices (to an extent which depends on the depth of the interlacing of the bits in the LDPC frames, and in a ratio which depends on the coding rate $$\frac{K}{N}$$

of the LDPC coding) to be able to integrate within the LDPC decoder the function for deinterlacing the bits in the LDPC frames.

Advantageously, the silicon surface area occupied by the additional SPMs and FIFOs necessary to accomplish this remains far below what a device dedicated to the deinterlacing function and comprising a dedicated memory would occupy.

Example where P=3, Q=3, N=12 and $$\frac{K}{N} = 1/2$$

In the text which follows, the index i indicates the ordinal number of an LLR in the stream of interlaced LLRs, and the index j indicates the ordinal number of the same LLR in the stream of deinterlaced LLRs. For example, the LLR of index i is labeled $L_i$. The first LLR in the stream of interlaced LLRs is $L_1$. It can be shown that the position j in the stream of deinterlaced LLRs for the $i^{th}$ LLR in the stream of interlaced LLRs received is given by the following relation:

$$j = \mod(i-1, Q) \times \frac{N}{Q} + \text{floor}\left(\frac{i-1}{Q}\right) + 1 \quad (1)$$

where "mod(A,B)" indicates the remainder of the Euclidean division of the number A by the number B, and "floor" is the mathematical function which returns the greatest integer less than the number passed as an argument.

Figure 14:
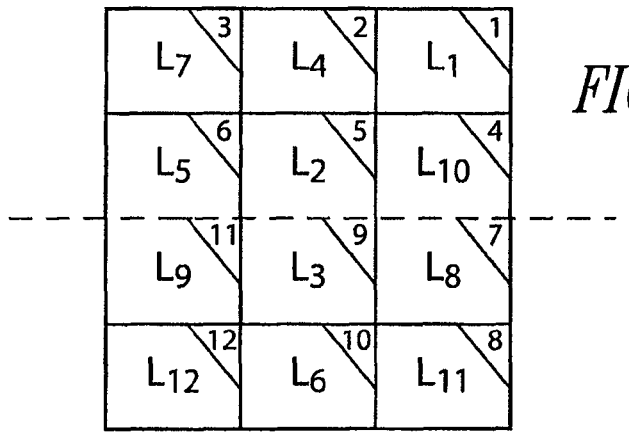
FIG. 14 is a diagram showing the loading of the input memory of the LDPC decoder in the case of the stream of LLRs in FIG. 9, when this stream is a stream of interlaced LLRs, according to one embodiment.

An example of loading the input memory will be presented with reference to the diagram in FIG. 14, where P=3, Q=3, N=12 and $$\frac{K}{N} = 1/2.$$

In FIG. 14, the LLRs in the stream of interlaced LLRs, labeled $L_i$ where i is between 1 and N, are shown in the N memory units of the memory map at the locations determined by the loading rules, taking into account the interlacing.

The index j, where j is between 1 and N, corresponds to the position of the corresponding LLRs in the stream of deinterlaced LLRs and is noted in the upper corner to the right of the memory unit, taking into account the memory loading rules resulting from the form of the H matrix.

The above relation (1) yields:
for $L_1$, where i−1=0=>j=0×4+0+1=1
for $L_2$, where i−1=1=>j=1×4+0+1=5
for $L_3$, where i−1=2=>j=2×4+0+1=9
for $L_4$, where i−1=3=>j=0×4+1+1=2
for $L_5$, where i−1=4=>j=1×4+1+1=6
for $L_6$, where i−1=5=>j=2×4+1+1=10
for $L_7$, where i−1=6=>j=0×4+2+1=3
for $L_8$, where i−1=7=>j=1×4+2+1=7
for $L_9$, where i−1=8=>j=2×4+2+1=11
for $L_{10}$, where i−1=9=>j=0×4+3+1=4
for $L_{11}$, where i−1=10=>j=1×4+3+1=8
for $L_{12}$, where i−1=11=>j=2×4+3+1=12

Receiving LLRs at the Rate of the Clock Signal

When the LLRs are received as input to the input memory loading device at the rate of one LLR per cycle of the clock signal CLK, there is no latency time for loading the input memory. It is therefore desirable to be able to write an average of one LLR per clock cycle in order to accommodate applications in which LLRs are received at the rate of one LLR per cycle of the CLK signal. This condition only needs to be met on the average, because in reality binary words of the first or second type are being written, each corresponding to a number L of LLRs. There are resulting conditions on the number L which are specific to information LLRs and specific to parity LLRs. These conditions will now be explained.

For information LLRs where the index i satisfies the relation i<K, we want the LLRs in the stream of interlaced LLRs with indices of i, i+Q, i+2·Q, . . . , i+(L−1)·Q, to belong to the same binary word of the first type. Thus the information LLRs in this word will be loaded into the same RAM memory in the memory map of the input memory. For this condition to be met, it can be shown that it is sufficient for the number which is equal to $$\frac{N}{Q \times L}$$

to be an integer.

For parity LLRs where the index i satisfies the relation i>K, we want the LLRs in the stream of interlaced LLRs with indices of i, $$i + \frac{Q}{P} \cdot (N-K), i + 2 \cdot \frac{Q}{P} \cdot (N-K), \ldots, i + (L-1) \cdot \frac{Q}{P} \cdot (N-K)$$

to belong to the same binary word of the second type. Thus the parity LLRs in this word will be loaded into the same RAM memory in the memory map of the input memory. For this condition to be met, it can be shown that it is sufficient for the number which is equal to $$\frac{\frac{N}{Q}}{(N-K) \times \frac{L}{P}}$$

to be an integer.

Required Number of SPMs and FIFOs

If one labels as "floor" the mathematical function which returns the greatest integer less than the number passed as an argument, the number Q1 of streams of binary words of the first type, and therefore the required number Q1 of SPMs, is equal to $$Q \times \frac{K}{N}$$

if the number $$Q \times \frac{K}{N}$$

is an integer, else is equal to $$\text{floor}\left(Q \times \frac{K}{N}\right) + 1.$$

Similarly, the number Q2 of streams of binary words of the second type, and therefore the required number Q2 of two-dimensional FIFO ring buffers, is equal to $$Q \times \left(1 - \frac{K}{N}\right)$$

if the number $$Q \times \frac{K}{N}$$

is an integer, else is equal to $$Q - \text{floor}\left(Q \times \frac{K}{N}\right).$$

For example:

if $Q = 3$ and $\frac{K}{N} = 3/5$, then Q1 = 2 and Q2 = 2, if $Q = 4$ and $\frac{K}{N} = 1/2$, then Q1 = 2 and Q2 = 2, if $Q = 5$ and $\frac{K}{N} = 1/2$, then Q1 = 3 and Q2 = 3, if $Q = 5$ and $\frac{K}{N} = 3/4$, then Q1 = 4 and Q2 = 2, and if $Q = 4$ and $\frac{K}{N} = 2/3$, then Q1 = 3 and Q2 = 2.

The SPMs receive the information LLRs as serial input, at the rate of the clock signal CLK. They issue words of L information LLRs (words of the first type) as parallel output, at a rate L times slower. The two-dimensional FIFO ring buffers have a number Wb of rows and each row has a width corresponding to a number L−1 of parity LLRs, for storing the corresponding binary words (which, after concatenation of an additional LLR, form words of the second type).

Example of Device with Interlacing

Figure 15:
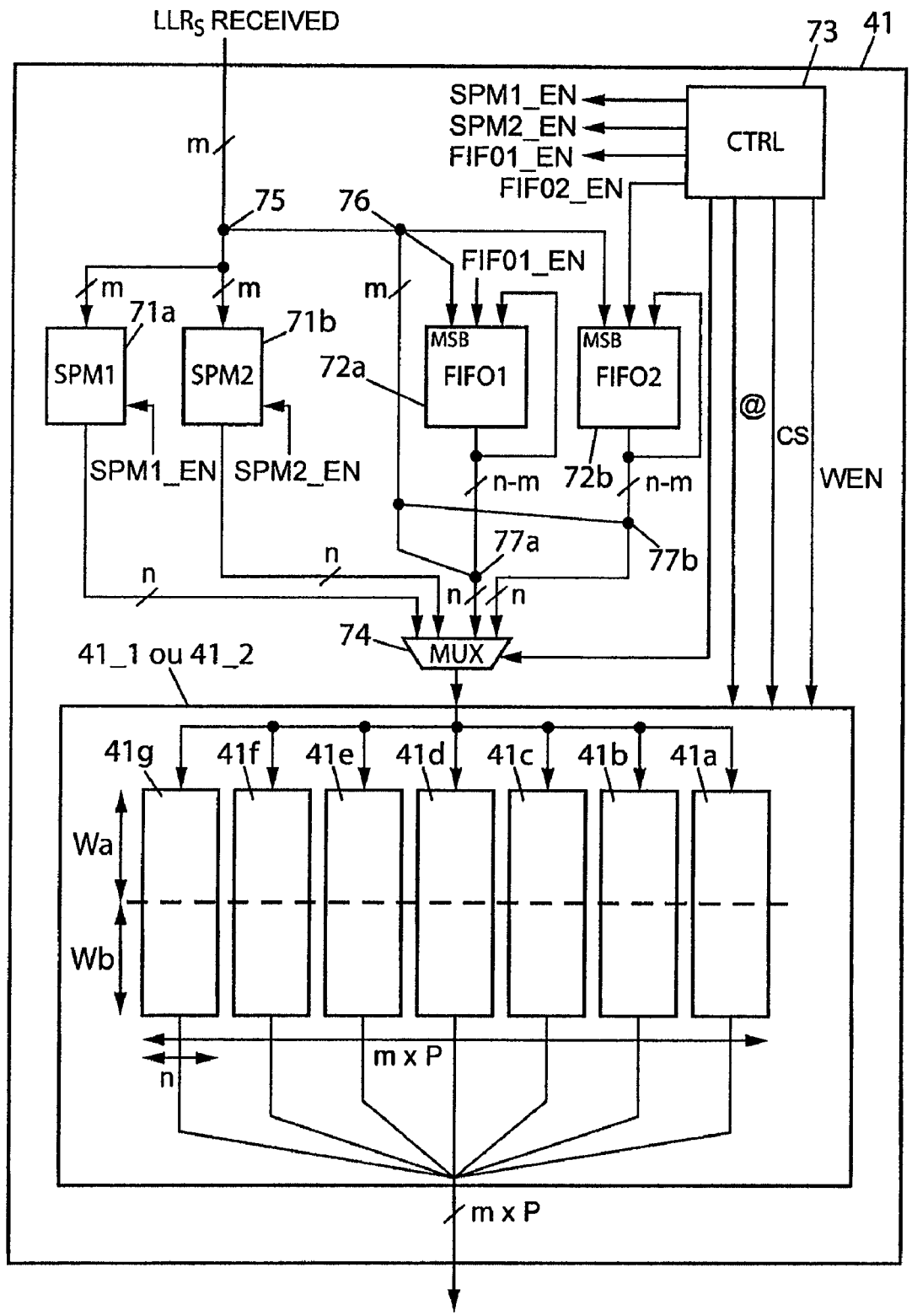
FIG. 15 is a diagram showing an example of a device according to one embodiment, adapted for deinterlacing a stream of interlaced LLRs simultaneously with its loading into memory.

With reference to FIG. 15, the device for loading the LDPC decoder input memory comprises, in the present example, two SPMs (because Q1=2 here) and two FIFOs (because Q2=2 here). These four elements are named SPM1, SPM2, FIFO1 and FIFO2 here, and they are respectively designated as 71a, 71b, 72a and 72b in the figure.

Structurally, the device in such a case is distinguished from the one described above with reference to the diagram in FIG. 7 (the case without deinterlacing), only in that it comprises the two parallel SPMs 71a and 71b between the functional node 75 and the multiplexer 74, and the two parallel FIFOs 72a and 72b between the functional node 76 and the multiplexer 74. Therefore the multiplexer comprises four inputs respectively linked to the output of the SPM 71a, the output of the SPM 71b, a functional node 77a corresponding to the output of the FIFO 72a, and a functional node 77b corresponding to the output of the FIFO 72b. Similarly, the control module 73 generates enable signals SPM1_EN, SPM2_EN, FIFO1_EN and FIFO2_EN, applied respectively to SPM 7a, SPM 7b, FIFO 72a and FIFO 72b. Otherwise the device is similar to the one in FIG. 7, and is therefore not described in detail again here.

Example of Operation with Interlacing

Figure 16:
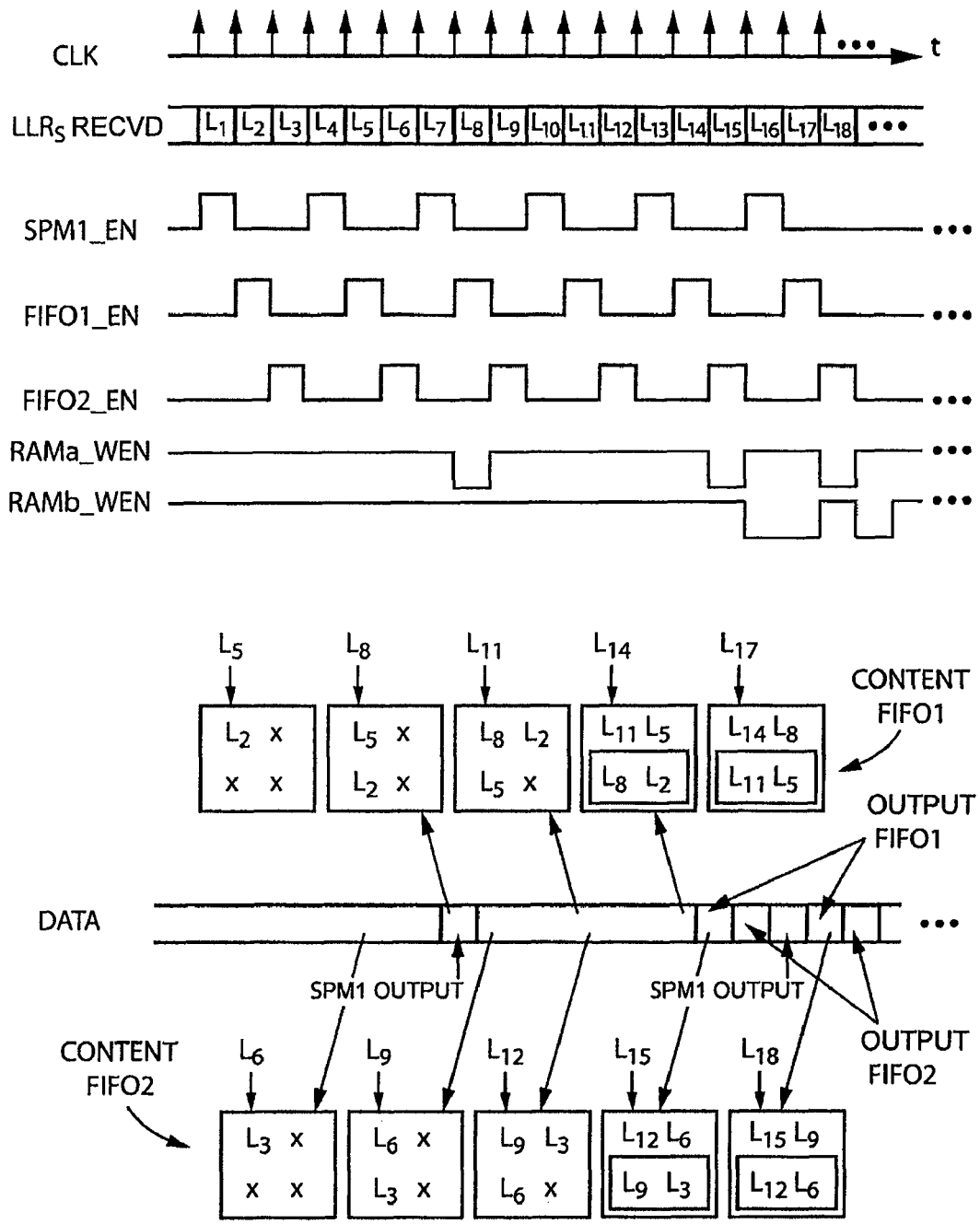
FIG. 16 shows signal timing diagrams to illustrate the operation of the device in FIG. 15, according to one embodiment.

The function of the device will now be described for receiving and loading into the memory map the LLRs from a stream of interlaced LLRs corresponding to an LDPC frame, as shown in the timing diagrams in FIG. 16. In this example, N=18, P=6, L=3, $$\frac{P}{L} = 2, r = \frac{K}{N} = 1/3,$$

Wa=1, Wb=2 and Q=3.

In this example, the memory map of the LDPC decoder input memory is formed of two RAM memories, 41a and 41b. In addition, the number Q1 of SPMs is equal to one, and the number Q2 of FIFOs is equal to 2. This example therefore corresponds to the device as shown in FIG. 15 except that the second SPM 71b is absent. It is for reasons of clarity that this further simplification was made in the example described here. In other words, generated in this example are a single stream of binary words of the first type (information LLRs) and two streams of binary words of the second type (parity LLRs).

The 1$^{st}$ line gives the leading edges of the CLK signal. The 2$^{nd}$ line indicates the LLRs received, labeled $L_1, L_2, \ldots, L_i, \ldots, L_{18}, \ldots$. This is a stream of interlaced LLRs. The 3$^{rd}$, 4$^{th}$, and 5$^{th}$ lines, the WEN signals, give the enable signals SPM1_EN, FIFO1_EN, and FIFO2_EN, for SPM 71a, FIFO 72a, and FIFO 72b respectively. The 6$^{th}$ and 7$^{th}$ lines give the write enable signals RAMa_WEN and RAMb_WEN for writing to the respective RAM memories 41a and 41b. These signals are breakdowns of the signal labeled WEN in FIG. 15 (see above). They are active (in the low logical state) to enable writing a binary word in page mode to the associated RAM memory. The 8$^{th}$ line indicates the clock cycles where data originating from the SPM 71a (events labeled "SPM1 output") and the FIFOs 72a and 72b (events labeled "FIFO1 output" and "FIFO2 output", respectively) are written to the memory map.

Above the 8$^{th}$ line is a symbolic representation of the evolution in the content of the FIFO 72a, which generates the first stream of binary words of the second type. Similarly, below this 8$^{th}$ line is a symbolic representation of the content of the FIFO 72b, which generates the second stream of binary words of the second type.

Under the control of the module 73 are formed with the aid of the SPM 71a a stream of $$\frac{P}{L} \times Wa = 2$$

binary words of the first type, each corresponding to a number L=3 of information LLRs, as well as, with the aid of FIFO 72a and 72b, a total of two streams of $$\frac{P}{L} \times Wb = 4$$

binary words of the second type (two such words per one such stream), each corresponding to a number L=3 of parity LLRs. For this purpose, the module 73 issues enable signals SPM1_EN, FIFO2_EN, and FIFO1_EN to SPM 71a, FIFO 72a, and FIFO 72b respectively.

Still under the control of the control module, one LLR received out of three from the stream of interlaced LLRs, starting with $L_1$, is directed toward the SPM 7a, one such LLR out of three starting with $L_2$ is directed toward FIFO 72a, and one such LLR out of three starting with $L_3$ is directed toward the second FIFO 72b.

Figure 17A:
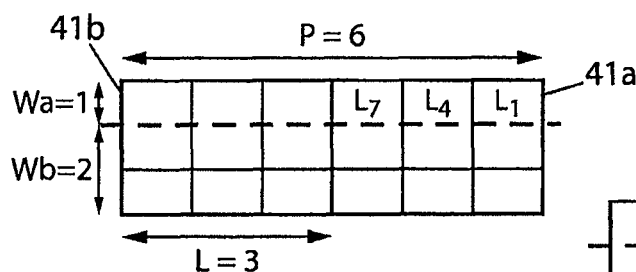
FIGS. 17A to 17F illustrate the loading of the memory in the context of the example shown in FIGS. 15 and 16, according to one embodiment.
Figure 17B:
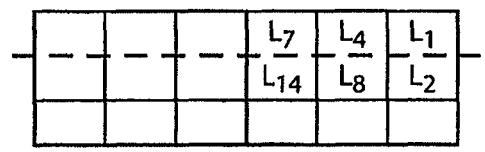
Figure 17C:
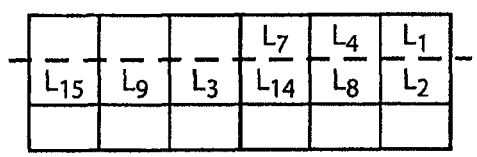
Figure 17D:
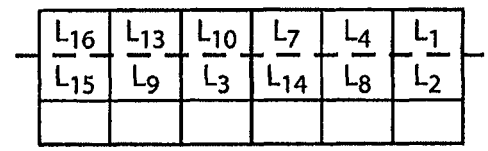

The two words $L_7L_4L_1$ and $L_{16}L_{13}L_{10}$ form the single stream of binary words of the first type, corresponding to the 6 information LLRs, with said stream created with the aid of the SPM 7a. After the receipt of $L_7$, the binary word $L_7L_4L_1$ is written to the RAM memory 41a so that the memory loading configuration is obtained as shown in FIG. 17a. After the receipt of $L_{16}$, the binary word $L_{16}L_{13}L_{10}$ is written to the RAM memory 4b, next to the previous one, so that the memory loading configuration is obtained as shown in FIG. 17d.

Figure 17E:
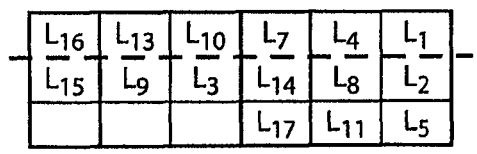

The two words $L_{14}L_8L_2$ and $L_{17}L_{11}L_5$ form the first stream of binary words of the second type, corresponding to 6 of the 12 parity LLRs, with said stream created with the aid of the FIFO 72a. After the receipt of $L_{14}$, the binary word $L_{14}L_8L_2$ is written to the RAM memory 41a so that the memory loading configuration is obtained as shown in FIG. 17b. After the receipt of $L_{17}$, the binary word $L_{17}L_{11}L_5$ is also written to the RAM memory 41a, below the previous word, so that the memory loading configuration is obtained as shown in FIG. 17e.

Figure 17F:
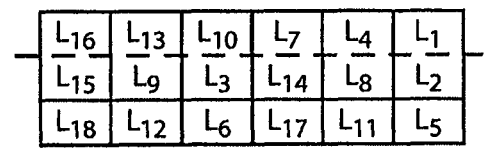

The two words $L_{15}L_9L_3$ and $L_{18}L_{12}L_6$ form the second stream of binary words of the second type, corresponding to the other 6 of the 12 parity LLRs, with said stream created with the aid of the FIFO 72b. After the receipt of $L_{15}$, the binary word $L_{15}L_{13}L_3$ is written to the RAM memory 41b so that the memory loading configuration is obtained as shown in FIG. 17c. After the receipt of $L_{18}$, the binary word $L_{18}L_{12}L_6$ is also written to the RAM memory 4b, below the previous word, so that the memory loading configuration is obtained as shown in FIG. 17f.

As is now better understood through the above example, the deinterlacing of the stream of interlaced LLRs received as input to the device, which leads to the formation of the stream of deinterlaced LLRs, and then the loading of the deinterlaced LLRs while respecting the memory loading constraints which result from the form of the H matrix, are performed at the same time. This mechanism works perfectly well, even when the LLRs are received at the rate of the clock signal of the LDPC decoder so there is no latency to exploit.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process comprising:
   loading an input memory of an LDPC decoder with data corresponding to an LDPC frame to be decoded and comprising a number N of log-likelihood ratios, or LLRs, of which a number K are information LLRs and a number N−K are parity LLRs, where N and K are integers, wherein:
   at least one stream is formed of binary words of a first type, each corresponding to multiple information LLRs, with the aid of a serial/parallel conversion module, and at least one stream is formed of binary words of a second type, each corresponding to multiple parity LLRs, with the aid of a row/column interlacing device comprising a two-dimensional first-in first-out (FIFO) ring buffer, and
   first memory accesses are made in page mode in order to write the binary words of the first type to a first zone of the input memory, and second memory accesses are made in page mode in order to write the binary words of the second type to a second zone of the input memory.

2. The process according to claim 1 wherein, as the second zone of the input memory comprises a specific number Wb of rows, the FIFO has a capacity of Wb binary words.

3. The process according to claim 1 wherein, as the first zone of the input memory is addressable by binary words each corresponding to a number L of parallel LLRs where L is a specific integer, the serial/parallel converter outputs the binary words of the first type as binary words corresponding to a number L of parallel information LLRs.

4. The process according to claim 1 wherein, as the second zone of the input memory is addressable by binary words each corresponding to a number L of parallel LLRs where L is a specific integer, the binary words of the second type are binary words corresponding to a number L of parallel parity LLRs, and the binary words stored in the FIFO are binary words corresponding to a number L−1 of parallel parity LLRs, with each such word issued by the FIFO supplemented by a parity LLR to form a binary word of the second type.

5. The process according to claim 1 wherein, as the LLRs are received in the form of a stream of interlaced LLRs with an interlacing depth corresponding to a number Q of LLRs, a deinterlacing is performed by forming in parallel a number Q1 of streams of binary words of the first type by means of Q1 respective serial/parallel conversion modules, and a number Q2 of streams of binary words of the second type by means of Q2 respective row/column interlacing devices each comprising a two-dimensional FIFO ring buffer, where Q1 and Q2 are specific integers which depend on a code rate $$\frac{K}{N}$$

of an LDPC coding and are such that $Q1+Q2 \geq Q$.

6. The process according to claim 5 wherein:
the number Q1 of streams of binary words of the first type is equal to $$Q \times \frac{K}{N}$$

if the number $$Q \times \frac{K}{N}$$

is an integer, else is equal to $$\text{floor}\left(Q \times \frac{K}{N}\right) + 1,$$

and
the number Q2 of streams of binary words of the second type is equal to $$Q \times \left(1 - \frac{K}{N}\right)$$

if the number $$Q \times \frac{K}{N}$$

is an integer, else is equal to $$Q - \text{floor}\left(Q \times \frac{K}{N}\right),$$

where "floor" indicates a mathematical function which returns the greatest integer less than a number passed as an argument.

7. The process according to claim 5 wherein the number which is equal to $$\frac{N}{Q \times L}$$

is an integer.

8. The process according to claim 5 wherein the number which is equal to $$\frac{\frac{N}{Q}}{(N-K) \times \frac{L}{P}}$$

is an integer, where P indicates a parallelism index for the LDPC decoder.

9. A device for loading an input memory of an LDPC decoder with data corresponding to an LDPC frame to be decoded and comprising a number N of log-likelihood ratios, or LLRs, of which a number K are information LLRs and a number N−K are parity LLRs, where N and K are integers, comprising:
at least one serial/parallel conversion module configured to form a stream of binary words of a first type, each corresponding to multiple information LLRs;
at least one row/column interlacing device which comprises a two-dimensional first-in first-out (FIFO) ring buffer and which is configured to form a stream of binary words of a second type, each corresponding to multiple parity LLRs; and a memory access control unit configured to write in page mode the binary words of the first type into a first zone of the input memory, and to write the binary words of the second type into a second zone of the input memory.

10. The device according to claim 9 wherein, as the second zone of the input memory comprises a given number Wb of rows, the FIFO has a capacity of Wb binary words.

11. The device according to claim 9 wherein, as the first zone of the input memory is addressable by binary words each corresponding to a number L of parallel LLRs where L is a specific integer, the serial/parallel converter is able to output the binary words of the first type as binary words corresponding to a number L of parallel information LLRs.

12. The device according to claim 9 wherein, as the second zone of the input memory is addressable by binary words each corresponding to a number L of parallel LLRs where L is a specific integer, the binary words of the second type are binary words corresponding to a number L of parallel parity LLRs, and the binary words stored in the FIFO are binary words corresponding to a number L−1 of parallel parity LLRs, with the device able to supplement each word issued by the FIFO with a parity LLR to form a binary word of the second type.

13. The device according to claim 9 wherein, as the LLRs are received in a form of a stream of interlaced LLRs with a depth of interlacing corresponding to a number Q of LLRs, the device is able to deinterlace the LLRs and comprises for this purpose a number Q1 of serial/parallel conversion modules to form in parallel Q1 respective streams of binary words of the first type, and a number Q2 of row/column interlacing devices to form Q2 respective streams of binary words of the second type, with said Q2 row/column interlacing devices each comprising a two-dimensional FIFO ring buffer, where Q1 and Q2 are specific integers which depend on the code rate $$\frac{K}{N}$$

of the LDPC coding and are such that $Q1+Q2 \geq Q$.

14. The device according to claim 13 wherein:

the number Q1 of streams of binary words of the first type is equal to $$Q \times \frac{K}{N}$$

if the number $$Q \times \frac{K}{N}$$

is an integer, else is equal to $$\text{floor}\left(Q \times \frac{K}{N}\right) + 1,$$

and the number Q2 of streams of binary words of the second type is equal to $$Q \times \left(1 - \frac{K}{N}\right)$$

if the number $$Q \times \frac{K}{N}$$

is an integer, else is equal to $$Q - \text{floor}\left(Q \times \frac{K}{N}\right),$$

where "floor" indicates a mathematical function which returns the greatest integer less than a number passed as an argument.

15. The device according to claim 13 wherein the number which is equal to $$\frac{N}{Q \times L}$$

is an integer.

16. The device according to claim 13 wherein the number which is equal to $$\frac{\frac{N}{Q}}{(N-K) \times \frac{L}{P}}$$

is an integer, where P indicates a parallelism index for the LDPC decoder.

17. An LDPC decoder comprising:

an input memory with data corresponding to an LDPC frame to be decoded and comprising a number N of log-likelihood ratios, or LLRs, of which a number K are information LLRs and a number N−K are parity LLRs, where N and K are integers;

at least one serial/parallel conversion module configured to form a stream of binary words of a first type, each corresponding to multiple information LLRs, as well as at least one row/column interlacing device which comprises a two-dimensional first-in first-out ring buffer and which is configured to form a stream of binary words of a second type, each corresponding to multiple parity LLRs; and a memory access control unit configured to write in page mode the binary words of the first type into a first zone of the input memory, and to write the binary words of the second type into a second zone of the input memory.

18. The LDPC decoder of claim 17 wherein, as the second zone of the input memory comprises a given number Wb of rows, the FIFO has a capacity of Wb binary words.

19. The LDPC decoder of claim 17 wherein, as the first zone of the input memory is addressable by binary words each corresponding to a number L of parallel LLRs where L is a specific whole number, the serial/parallel converter is able to output the binary words of the first type as binary words corresponding to a number L of parallel information LLRs.

20. The LDPC decoder of claim 17 wherein as the LLRs are received in a form of a stream of interlaced LLRs with a depth of interlacing corresponding to a number Q of LLRs, the device is able to deinterlace the LLRs and comprises for this purpose a number Q1 of serial/parallel conversion modules to form in parallel Q1 respective streams of binary words of the first type, and a number Q2 of row/column interlacing devices to form Q2 respective streams of binary words of the second type, with said Q2 row/column interlacing devices each comprising a two-dimensional FIFO ring buffer, where Q1 and Q2 are specific whole numbers which depend on the code rate $$\frac{K}{N}$$

of the LDPC coding and are such that $Q1+Q2 \geq Q$.

21. The LDPC decoder of claim 20 wherein the number which is equal to $$\frac{N}{Q \times L}$$

is a whole number.

22. The LDCP decoder of claim 20 wherein the number which is equal to $$\frac{\frac{N}{Q}}{(N-K) \times \frac{L}{P}}$$

is a whole number, where P indicates a parallelism index for the LDPC decoder.

23. An apparatus comprising:
an LDPC decoder including an input memory with data corresponding to an LDPC frame to be decoded and comprising a number N of log-likelihood ratios, or LLRs, of which a number K are information LLRs and a number N−K are parity LLRs, where N and K are whole numbers;
at least one serial/parallel conversion module configured to form a stream of binary words of a first type, each corresponding to multiple information LLRs;
at least one row/column interlacing device which comprises a two-dimensional first-in first-out ring buffer and which is configured to form a stream of binary words of a second type, each corresponding to multiple parity LLRs; and
a memory access control unit configured to write in page mode the binary words of the first type into a first zone of the input memory, and to write the binary words of the second type into a second zone of the input memory.

24. The apparatus of claim 23 wherein, as the second zone of the input memory comprises a given number Wb of rows, the FIFO has a capacity of Wb binary words.

25. The apparatus of claim 23 wherein, as the first zone of the input memory is addressable by binary words each corresponding to a number L of parallel LLRs where L is a specific whole number, the serial/parallel converter is able to output the binary words of the first type as binary words corresponding to a number L of parallel information LLRs.

26. The apparatus of claim 23 wherein as the LLRs are received in a form of a stream of interlaced LLRs with a depth of interlacing corresponding to a number Q of LLRs, the device is able to deinterlace the LLRs and comprises for this purpose a number Q1 of serial/parallel conversion modules to form in parallel Q1 respective streams of binary words of the first type, and a number Q2 of row/column interlacing devices to form Q2 respective streams of binary words of the second type, with said Q2 row/column interlacing devices each comprising a two-dimensional FIFO ring buffer, where Q1 and Q2 are specific whole numbers which depend on the code rate $$\frac{K}{N}$$

of the LDPC coding and are such that Q1+Q2≧Q.

27. The apparatus of claim 26 wherein the number which is equal to $$\frac{N}{Q \times L}$$

is a whole number.

28. The apparatus of claim 26 wherein the number which is equal to $$\frac{\frac{N}{Q}}{(N-K) \times \frac{L}{P}}$$

is a whole number, where P indicates a parallelism index for the LDPC decoder.

29. The apparatus of claim 26, further comprising a demodulator.

* * * * *